(12) United States Patent
Wang

(10) Patent No.: US 11,404,390 B2
(45) Date of Patent: Aug. 2, 2022

(54) SEMICONDUCTOR DEVICE ASSEMBLY WITH SACRIFICIAL PILLARS AND METHODS OF MANUFACTURING SACRIFICIAL PILLARS

(71) Applicant: Micron Technology, Inc., Boise, ID (US)

(72) Inventor: Chao Wen Wang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 16/916,325

(22) Filed: Jun. 30, 2020

(65) Prior Publication Data
US 2021/0407944 A1 Dec. 30, 2021

(51) Int. Cl.
*H01L 21/00* (2006.01)
*H01L 23/00* (2006.01)

(52) U.S. Cl.
CPC .............. *H01L 24/11* (2013.01); *H01L 24/13* (2013.01); *H01L 2224/11011* (2013.01); *H01L 2224/1146* (2013.01); *H01L 2224/1147* (2013.01); *H01L 2224/11912* (2013.01)

(58) Field of Classification Search
CPC .................... H01L 24/11; H01L 24/13; H01L 2224/11011
See application file for complete search history.

(56) References Cited

U.S. PATENT DOCUMENTS

| | | | | |
|---|---|---|---|---|
| 8,810,029 B2 * | 8/2014 | Pendse | .................. | H01L 21/563 257/781 |
| 8,841,779 B2 * | 9/2014 | Pendse | .................. | H05K 1/111 257/778 |
| 9,064,858 B2 * | 6/2015 | Pendse | .................... | H01L 24/29 |
| 9,159,665 B2 * | 10/2015 | Pendse | .............. | H01L 23/49838 |
| 9,773,685 B2 * | 9/2017 | Pendse | .................. | H01L 21/563 |
| 9,922,915 B2 * | 3/2018 | Pendse | .............. | H01L 23/49811 |
| 11,081,460 B2 * | 8/2021 | Yeruva | .................... | H01L 24/14 |
| 11,164,837 B1 * | 11/2021 | Arifeen | .................. | H01L 24/81 |
| 2018/0090460 A1 * | 3/2018 | Chu | ..................... | H01L 23/3192 |
| 2019/0393176 A1 * | 12/2019 | Gambee | .................. | H01L 24/12 |
| 2020/0185156 A1 * | 6/2020 | Arvin | ..................... | H01G 4/228 |
| 2020/0211993 A1 * | 7/2020 | Yeruva | .................... | H01L 24/11 |
| 2021/0035966 A1 * | 2/2021 | Tsai | .................... | H01L 23/5385 |

(Continued)

FOREIGN PATENT DOCUMENTS

CN 113871312 A * 12/2021 ............. H01L 24/11

*Primary Examiner* — Laura M Menz
(74) *Attorney, Agent, or Firm* — Perkins Coie LLP

(57) ABSTRACT

Sacrificial pillars for a semiconductor device assembly, and associated methods and systems are disclosed. In one embodiment, a region of a semiconductor die may be identified to include sacrificial pillars that are not connected to bond pads of the semiconductor die, in addition to live conductive pillars connected to the bond pads. The region with the sacrificial pillars, when disposed in proximity to the live conductive pillars, may prevent an areal density of the live conductive pillars from experiencing an abrupt change that may result in intolerable variations in heights of the live conductive pillars. As such, the sacrificial pillars may improve a coplanarity of the live conductive pillars by reducing variations in the heights of the live conductive pillars. Thereafter, the sacrificial pillars may be removed from the semiconductor die.

9 Claims, 9 Drawing Sheets

(56) References Cited

U.S. PATENT DOCUMENTS

| | | | |
|---|---|---|---|
| 2021/0183811 A1* | 6/2021 | Lee | H01L 24/94 |
| 2021/0272921 A1* | 9/2021 | Arifeen | H01L 24/81 |
| 2021/0343670 A1* | 11/2021 | Yeruva | H01L 24/03 |
| 2021/0407944 A1* | 12/2021 | Wang | H01L 24/13 |

* cited by examiner

SEMICONDUCTOR DEVICE ASSEMBLY WITH SACRIFICIAL PILLARS AND METHODS OF MANUFACTURING SACRIFICIAL PILLARS

TECHNICAL FIELD

The present disclosure generally relates to semiconductor device assemblies, and more particularly relates to sacrificial pillars for a semiconductor device assembly.

BACKGROUND

Semiconductor packages typically include a semiconductor die (e.g., memory chip, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, direct chip attach methods (e.g., flip-chip bonding between the semiconductor die and the substrate) may be used to reduce the footprint of the semiconductor packages. Such direct chip attach methods may include directly connecting multiple conductive pillars of the semiconductor die to corresponding conductive structures (e.g., conductive bumps) of the substrate. Further, a solder structure may be formed over individual conductive pillars to facilitate bonding between the conductive pillars and the corresponding conductive structures—e.g., forming interconnects (which may be referred to as joints) that each include the conductive pillar, the solder structure, and the conductive structure. When the conductive pillars have different heights, conductive pillars that are too short may not be connected to corresponding conductive structures resulting in "opens" (which may be referred to as non-joints), while conductive pillars that are too tall may be crushed against corresponding conductive structures to result in "smashed" joints. Further, the smashed joints may touch one or more neighboring joints resulting in unwanted electrical shorts between them.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
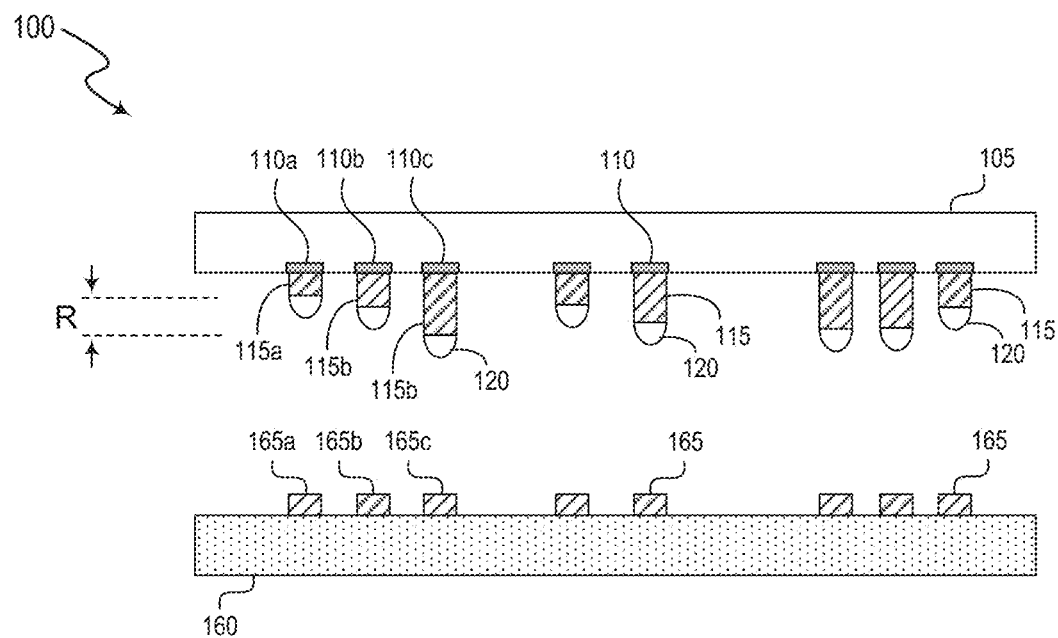
FIG. 1A is a cross-sectional diagram of a semiconductor device assembly.

Specific details of several embodiments utilizing sacrificial pillars ("dummy" pillars) for controlling heights of electrically active conductive pillars ("live" conductive pillars) of semiconductor dies, and associated systems and methods are described below. Live conductive pillars are attached to bond pads to carry electrical signals in and/or out of the semiconductor dies. Such semiconductor dies may include live conductive pillars with heights in a predetermined range such that yield or reliability performance of direct chip attach methods (e.g., flip-chip bonding methods) to form semiconductor device assemblies may be improved by reducing incidents of non-joints and/or smashed joints. The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2 through 5.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature, These terms, however, should be construed broadly to include semiconductor devices having other orientations.

FIG. 1A is a cross-sectional view of a semiconductor device assembly 100 having a semiconductor die 105 and a substrate 160 shown before they are attached together to form the semiconductor device assembly 100—e.g., using a flip-chip bonding method. The semiconductor die 105 includes bonds pads 110 (also identified individually as 110a-c) and conductive pillars 115 (also identified individually as 115a-c) formed on the bond pads 110. The bond pads 110 may be connected to various functional features of the semiconductor die 105. The semiconductor die 105 can also have solder connectors 120 formed on the conductive pillars 115. The semiconductor die 105 is "flipped" in FIG. 1A such that an active side of the semiconductor die 105 with the functional features faces the substrate 160. The conductive pillars 115 may include copper (Cu) and the solder connectors 120 may include a tin-based alloy. The substrate 160 includes conductive structures 165 (also identified individually as 165a-c) that may be further connected to terminals (not shown) outside a protective covering of the semiconductor device assembly. The substrate 160 may include silicon (e.g., silicon interposer) or organic materials (e.g., printed circuit board (PCB)). The conductive structures 165 may include copper. When the semiconductor die 105 and the substrate 160 are bonded together, individual conductive pillars 115 may be connected to corresponding conductive structures 165 via the solder connectors 120 to form joints (or interconnects).

FIG. 1A illustrates that the heights of the conductive pillars 115 may not be uniform. For example, the conductive pillar 115a may depict the shortest conductive pillar of the semiconductor die 105, while the conductive pillar 115c may depict the tallest conductive pillar of the semiconductor die 105, The height difference between the conductive pillar 115a and the conductive pillar 115c may correspond to a range (R) of pillar heights of the conductive pillars 115 of the semiconductor die 105, which may be referred to as a coplanarity of the conductive pillars 115. The coplanarity of the conductive pillars 115 is a useful parameter in direct chip attach methods because metallurgical constructions of various components that forms joints (e.g., conductive pillars 115, solder connectors 120, and conductive structures 165) should be defined to be within a coplanarity tolerance.

By way of example, if the semiconductor die 105 is mounted to the substrate 160 such that only the taller conductive pillar 115c is electrically coupled to the conductive structure 165c, the relatively shorter conductive pillars 115a and 115b may not be electrically coupled to their corresponding conductive structures 165a or 165b. This can cause opens (or high resistances) due to non-joints or marginal joints between the conductive pillars 115a,b and conductive structures 165a,b. On the other hand, if the semiconductor die 105 is mounted to the substrate 160 such that the conductive pillar 115a is electrically coupled to the conductive structure 165a, the conductive pillar 115b or the conductive pillar 115c may be excessively pressed into their corresponding conductive structures 165b or 165c. This can cause smashed joints that may degrade structural integrity of joints and cause reliability issues during the lifetime of the semiconductor device assembly or catastrophic failures by electrically shorting with neighboring joints (e.g., shorts between bond pads 110b and 110c).

Maintaining a coplanarity of the conductive pillars 115 within a tolerable limit may be difficult when areal densities of conductive pillars 115 (i.e., areal densities of bond pads 110) vary within the semiconductor die 105 due to, in some cases, interface configurations of the semiconductor die 105 (e.g., a logic die in a high bandwidth memory (HBM) module) defined by an industry standard specification. In some embodiments, process steps that form conductive pillars 115 (e.g., an electrochemical plating process using a plating solution, which forms conductive pillars (e.g., copper) on metallic surfaces exposed to the plating solution) are prone to generate different heights of conductive pillars 115 based on the areal density of conductive pillars 115. The areal density corresponds to a percentage of area occupied by the conductive pillars (e.g., metallic surface areas exposed to the plating solution) within a unit area, which may influence the metal deposition rate during the electrochemical plating process. More specifically, the metal deposition rate may be directly or inversely proportional to the areal density. Additionally, sparsely populated conductive pillars 115 in a first region may include taller (or shorter) heights than that of densely populated conductive pillars 115 in a second region when the first and second regions have a same surface area. As such, the coplanarity of conductive pillars 115 may further degrade when a region with a high areal density of conductive pillars 115 is located next to an open region exclusive of conductive pillars 115 due to an abrupt and substantial change in the areal density of conductive pillars 115—e.g., conductive pillars 115 near the open area could be much taller (or shorter) than conductive pillars 115 located far away from the open region.

Figure 1B:
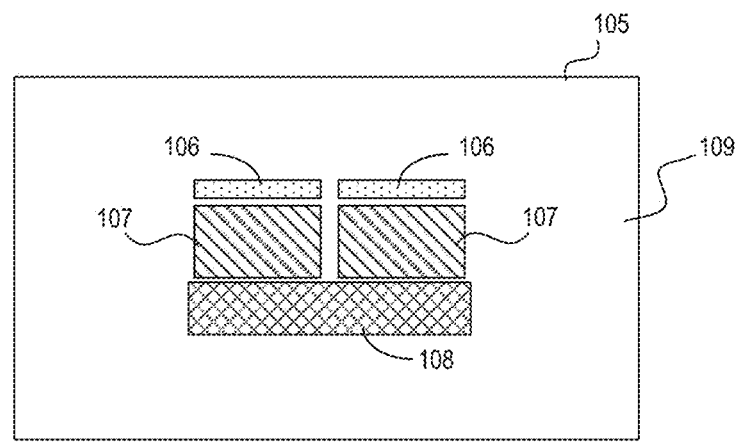
FIG. 1B is a plan view of a semiconductor die.

FIG. 1B is a plan view of a semiconductor die 105 that further illustrates the areal densities. For example, the semiconductor die 105 can include first areas 106, second areas 107, and a third area 108. The semiconductor die 105 can also include a field region 109. The areas 106, 107, and 108 may include different areal densities of live conductive pillars—e.g., the areas 106 including a first areal density, the areas 107 including a second areal density, the area 108 including a third areal density. For example, the third areal density may be greater than the second areal density, which is greater than the first areal density. In some embodiments, the field region 109 may not have live conductive pillars pursuant to an industry standard specification (e.g., Joint Electron Device Engineering Council (JEDEC)). For example, a JEDEC specification for high-bandwidth memory (HBM) module may require the field region 109 without any live conductive pillars (or corresponding bond pads). As such, the semiconductor die 105 may be an example of or includes aspects of a logic die (or an interface die) for an HBM module, which may be connected to a package substrate or an interposer (e.g., silicon interposer).

Since the heights of the live conductive pillars depend on their areal density, an average height of the conductive pillars in the third area 108 (having the greatest areal density of conductive pillars) of the semiconductor die 105 may be less than that of the conductive pillars in either the first areas 106 or the second areas 107 of the semiconductor die 105. Further, within the third area 108 of the semiconductor die 105, the conductive pillars located at the outer edge facing the field region 109 may include greater heights when compared to the heights of the conductive pillars located at the center of the third area 108 because a local areal density of conductive pillars at the outer edge may be less (due to the absence of live conductive pillars in the field region 109) than that of the center of the third area 108. In some cases, a coplanarity of conductive pillars in the semiconductor die 105 (e.g., variations in the heights of conductive pillars in the semiconductor die 105) may be prone to generate non-joints and/or smashed joints during a flip-chip bonding process to form an HBM module.

To overcome the foregoing challenges, embodiments of the present technology improve the coplanarity of conductive pillars of a semiconductor die to mitigate risks associated with non-joints or smashed joints. In an embodiment, a region of the semiconductor die may have one or more sacrificial pillars that are not connected to bond pads of the semiconductor die (e.g., electrically inactive) and are eventually removed from the semiconductor die after forming the live conductive pillars. Such a region may correspond to a field region exclusive of live conductive pillars or a region having sparsely populated live conductive pillars. The region with the sacrificial pillars, when defined next to an area of the semiconductor die having live conductive pillars, may prevent an areal density of the live conductive pillars from experiencing an abrupt change. That is, the region having sacrificial pillars may be regarded as a buffer zone to maintain (or at least to prevent an abrupt change in) the areal density of the live conductive pillars beyond the area occupied by the live conductive pillars. In this manner, variations in heights of the live conductive pillars may be reduced such that the heights of live conductive pillars in the area are within acceptable tolerance. The presence of the sacrificial pillars proximate to the live conductive pillars is expected to improve the coplanarity of live conductive pillars. The sacrificial pillars may be removed from the semiconductor die after the live conductive pillars have been formed.

Figure 2A:
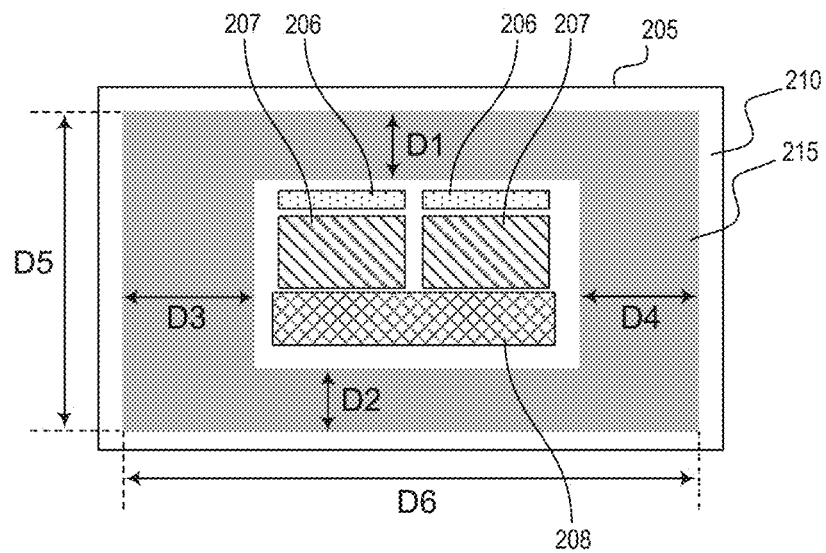
FIG. 2A is a plan view of a semiconductor die in accordance with an embodiment of the present technology.

FIG. 2A is a top plan view of the semiconductor die 205 in accordance with the present technology that includes at least one first area 206 having a first areal density of live conductive pillars, at least one second area 207 having a second areal density of live conductive pillars, and an optional third area 208 having a third areal density of live conductive pillars. The first-third areas 206-208 can correspond to the first-third areas 106-108 described above with reference to FIG. 1B. The semiconductor die 205 can further include a field region 210 and a sacrificial pillar region 215 in the field region 210. The sacrificial pillar region 215 may have a fourth areal density of sacrificial pillars. In some embodiments, the fourth areal density may be approximately same (e.g., no more than 5% difference, no more than 10% difference, no more than 15% difference, or the like) as one of the areas with live conductive pillars—e.g., the first areal density of the areas 206, the second areal density of the areas 207, the third areal density of the area 208. In some embodiments, the fourth areal density may be approximately same (e.g., no more than 5% difference, no more than 10% difference, no more than 15% difference, or the like) as an average of two or more areal densities of the areas including live conductive pillars—e.g., two or more of the first, second, and third areal densities of the first, second, and third areas 206 through 208. In some embodiments, the fourth areal density may be approximately same (e.g., no more than 5% difference, no more than 10% difference, no more than 15% difference, or the like) as a weighted average of two or more areal densities of the areas including live conductive pillars, where the weight may be determined based on respective surface areas occupied by the first, second, and third areas 206 through 208.

In this manner, the sacrificial pillar region 215 with the fourth areal density of sacrificial pillars may provide a buffer zone for the live conductive pillars in the first, second, and third areas 206 through 208. The buffer zone (together with the areas including live conductive pillars) may achieve a more uniform plating pattern loading across the semiconductor die 205 such that respective areal densities of conductive pillars in the first, second, and third areas 206 through 208 may avoid a sudden transition from the respective areal densities to the zero areal density of the field region 210—e.g., enhancing the coplanarity of the live conductive pillars of the semiconductor die 205. The transition in areal densities from the first-third regions 206-208 can be smoother than without the sacrificial pillar region 215. In this regard, the sacrificial pillar region 215 with the fourth areal density may establish an overall areal density of conductive pillars for the semiconductor die 205 (i.e., the sacrificial pillar region 215, the areas including live conductive pillars, taken together) such that the live conductive pillars in the first, second, and third areas 206 through 208 may experience a relatively smooth variations in local areal densities for the live conductive pillars in the first, second, and third areas 206 through 208. As such, the heights of live conductive pillars of the semiconductor die 205 may be within a range that may be determined based on the first areal density of the areas 206, the second areal density of the areas 207, the third areal density of the area 208, the fourth areal density of the sacrificial pillar region 215, or any combination thereof.

Further, a coplanarity within the sacrificial pillar region 215 (e.g., variations in heights of sacrificial pillars within the sacrificial pillar region 215) may be disregarded because the sacrificial pillars are subsequently removed. As such, a coplanarity of the live conductive pillars of the semiconductor die 205 may be determined by a distribution in the heights of the live conductive pillars only (i.e., variations in the heights of live conductive pillars in the first areas 206, the second areas 207, and the third area 208), thereby improving (i.e., enhancing) the coplanarity of the semiconductor die 205 when compared to the coplanarity of conductive pillars in the semiconductor die 105. In some embodiments, a lateral dimension (e.g., any one of the dimensions D1 through D6) of the sacrificial pillar region 215 having the fourth areal density may be determined based on the areal density of the areas including live conductive pillars—e.g., the first areal density of the areas 206, the second areal density of the areas 207, the third areal density of the area 208, or a combination thereof. Further, the fourth areal density may be correlated to the areal densities of the areas including live conductive pillars (e.g., the first areal density of the areas 206, the second areal density of the areas 207, the third areal density of the area 208, or a combination thereof) such that the heights of the live conductive pillars of the semiconductor die 205 may be within a predetermined range—e.g., heights of live conductive pillars in the areas 206 through 208 are within a predetermined range.

Figure 2B:
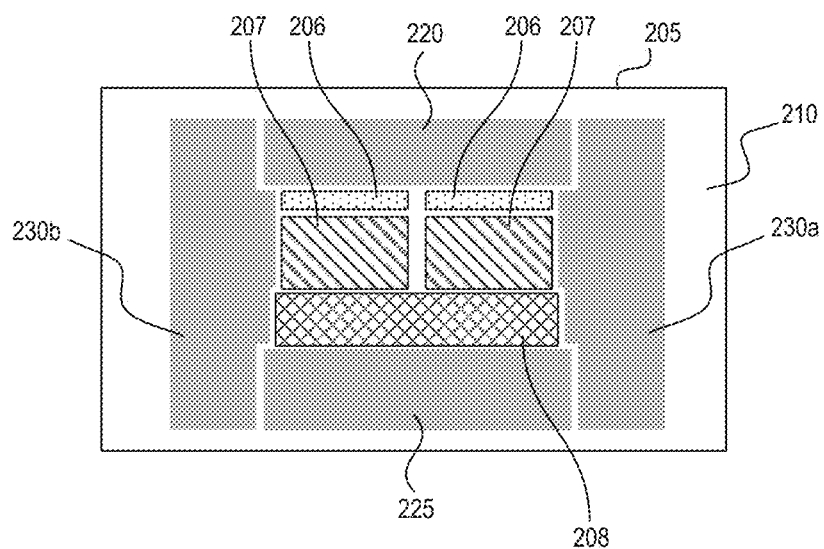
FIG. 2B is a plan view of a semiconductor die in accordance with an embodiment of the present technology

FIG. 2B is a top plan view of the semiconductor die 205 with multiple sacrificial pillar regions 220, 225, and 230 instead of a single sacrificial pillar region 215 as shown in FIG. 2A. The sacrificial pillar regions 220, 225, and 230 may have different areal densities of sacrificial pillars. For example, the sacrificial pillar region 220 may have the same areal density of sacrificial pillars as the first areal density of the first areas 206 such that the sacrificial pillar region 220 may "extend" the first areal density of the first areas 206 beyond the first areas 206, at least in the direction toward the sacrificial pillar region 220. Similarly, the sacrificial pillar region 225 may have the same areal density of sacrificial pillars as the third areal density of the third area 208 such that the sacrificial pillar region 225 may "extend" the third areal density of the third areas 208 beyond the third area 208, at least in the direction toward the sacrificial pillar region 225. Further, the sacrificial pillar regions 230 may have the same areal density of the sacrificial pillar region 215 described with reference to FIG. 2A.

The embodiments shown and described with reference to FIGS. 2A and 2B are examples of the principles of the present technology, but the present technology is not limited thereto. For example, a semiconductor die 205 may include different quantities of sacrificial pillar regions (e.g., two, three, five, eight, or even more) than those depicted in FIGS. 2A and 2B. Further, the sacrificial pillars may be interspersed in certain areas having live conductive pillars (e.g., an area with sparsely populated live conductive pillars) to modify (e.g., increase) local areal density of pillars (e.g., live conductive pillars and sacrificial pillars, collectively) therein. Additionally or alternatively, plan-view shapes of sacrificial pillar regions may be different than the rectangular (or modified rectangular) shapes depicted in FIGS. 2A and 2B, e.g., any multi-faceted polygon shapes suitable to reduce variations in areal densities of conductive pillars within the semiconductor die 205.

FIGS. 3A through 3E illustrate stages of a process utilizing (e.g., forming and removing) sacrificial pillars to improve (i.e., enhance) a coplanarity of live conductive pillars of a semiconductor die. As described in more detail below, one or more sacrificial pillar regions may be defined to have a sacrificial layer formed therein. Subsequently, sacrificial pillars (on the sacrificial layer) and live conductive pillars (on corresponding bond pads) may be formed on the semiconductor die using a plating process (e.g., Cu plating process that concurrently forms the sacrificial pillars and live conductive pillars). The sacrificial pillars may provide a more uniform areal density of pillars (e.g., providing a more uniform plating pattern loading when compared to that without the sacrificial pillars) during the plating process such that the coplanarity of live conductive pillars may be improved. The sacrificial pillars may be removed from the semiconductor die by selectively removing the sacrificial layer, on which the sacrificial pillars are formed. The sacrificial pillar regions may retain materials that have been protected under the sacrificial pillars (e.g., imprints or remnants of the sacrificial pillars), where the materials correspond to a seed layer for the plating process.

Figure 3A:
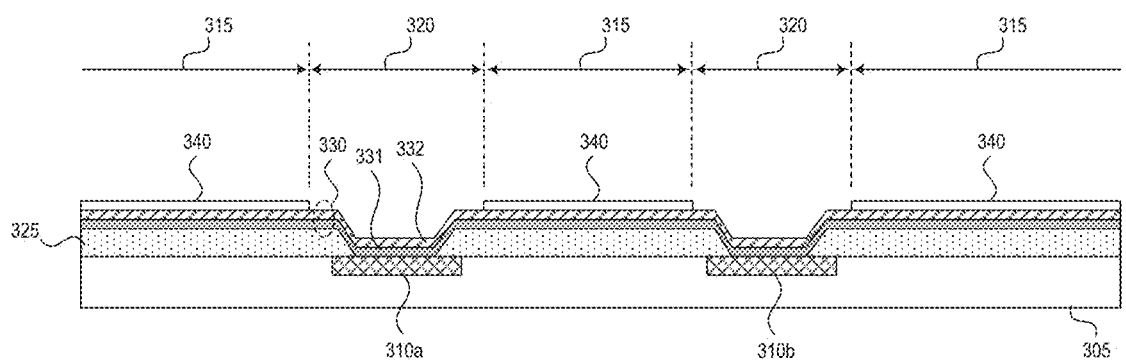
FIGS. 3A through 3E illustrate stages of a process utilizing sacrificial pillars in accordance with an embodiment of the present technology.

FIG. 3A is a cross-sectional diagram of a semiconductor die 305, which may be an example of or include aspects of the semiconductor die 205 described with reference to FIG. 2A or 2B. For example, the semiconductor die 305 includes sacrificial pillar regions 315, which may be an example of or include aspects of the sacrificial pillar regions 215, 220, 225, or 230. Further, the semiconductor die 305 includes areas 320 with live conductive pillars ("live conductive pillar areas"), which may be examples of or include aspects of the first, second, third areas 206, 207, or 208. The semiconductor die 305 also can include a passivation layer 325 through which openings may be formed to expose top surfaces of bond pads 310. The semiconductor die may further have a seed layer 330, which may be formed over the entire semiconductor die 305 in some cases (which may be referred to as a blanket seed layer). In some embodiments, the seed layer may be formed using a physical vapor deposition (PVD) process. In some embodiments, the seed layer 330 may be a composite layer including two or more layers, e.g., a conductive adhesive layer 331 (e.g., including titanium) and a conductive seed layer 332 (e.g., Cu-seed layer including copper).

At this stage of the process, a sacrificial layer 340 has been selectively formed in the sacrificial pillar regions 315. In some embodiments, the sacrificial layer 340 may be formed over the entire semiconductor die 305 after the seed layer 330 is formed (e.g., W deposition by PVD or chemical vapor deposition (CVD) processes, or a TiW alloy on the seed layer 330). Also, the sacrificial layer 340 may be electrically conductive to facilitate the plating process to form sacrificial pillars over the sacrificial layer 340. Subsequently, a photolithography process may be used to cover the sacrificial pillar regions 315 with a photoresist while the sacrificial layer 340 in the live conductive pillar areas 320 is removed. An etch process (e.g., dry etch process using a plasma or wet etch process using a chemical solution) may be performed to remove the portion of the sacrificial layer 340 in the live conductive pillar areas 320 while preserving the seed layer 330 (or having a slower etch rate of the seed layer 330 when compared to the etch rate of the sacrificial layer 340) underneath the sacrificial layer 340—e.g., the etch process may be selective to the seed layer 330 (e.g., the conductive seed layer 332). In this manner, the sacrificial layer 340 may be formed on the seed layer 330 in the sacrificial pillar regions 315. Further, the seed layer 330 covers the bond pads 310.

Figure 3B:
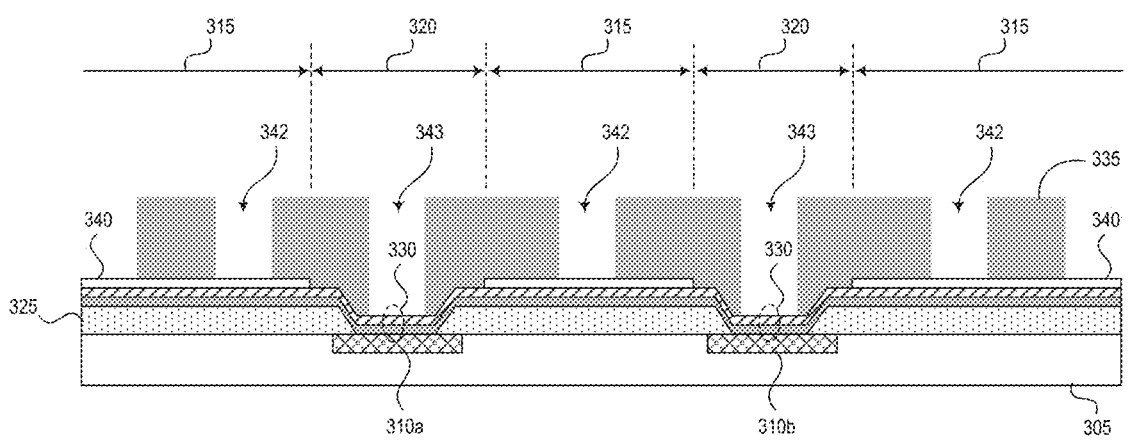

FIG. 3B is a cross-sectional diagram of the semiconductor die 305 after photolithography process steps have been performed to define openings 342 and 343 in a photoresist layer 335. The openings 342 can be formed over the sacrificial layer 340 in the sacrificial pillar regions 315. The openings 343 can be formed over the corresponding bond pads 310 in the corresponding live conductive pillar areas 320. As described with reference to FIG. 2A or 2B, areal densities of the openings in the sacrificial pillar regions 315 may correlate to areal densities of the openings in the live conductive pillar areas 320 such that heights of the live conductive pillars formed in the live conductive pillar areas 320 may be within a predetermined range. In some cases, the areal density of openings in the sacrificial pillar regions 315 may be approximately same (e.g., no more than 5% difference, no more than 10% difference, no more than 15% difference, or the like) as the areal density of openings in the live conductive pillar areas 320. Subsequently, a plating process (e.g., Cu-plating process) may be performed using a plating solution that deposits metallic material (e.g., copper) over the metal surfaces exposed to the plating solution (e.g., surfaces of the bond pad not covered by the photoresist layer 335, surfaces of the sacrificial layer not covered by the photoresist layer 335).

Figure 3C:
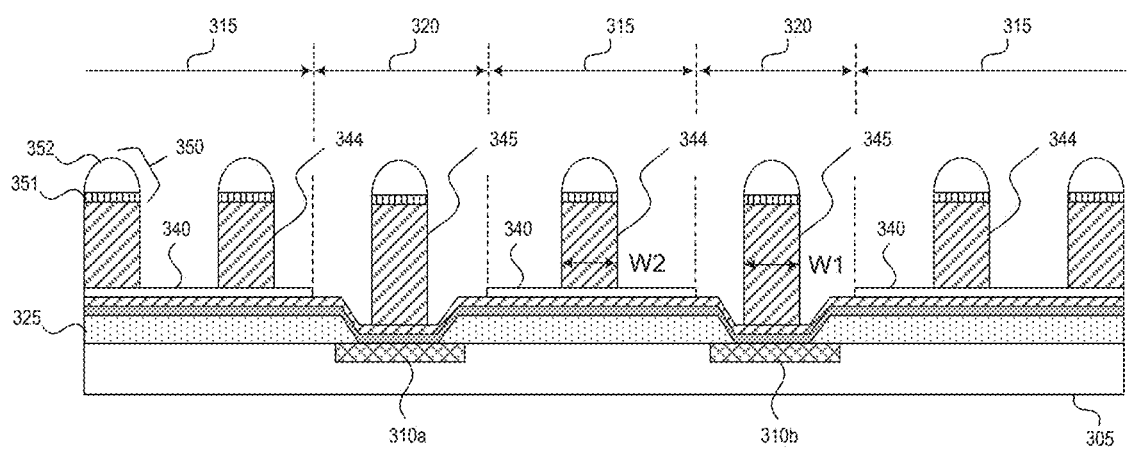

FIG. 3C illustrates the semiconductor die 305 after the plating process (e.g., Cu-plating process) is completed to form the sacrificial pillars 344 and the live conductive pillars 345. The plating process may concurrently form the sacrificial pillars 344 and the live conductive pillars 345 such that the sacrificial pillars 344 may be conductive and include a common metallic component (e.g., copper) as the live conductive pillars 345, The sacrificial pillars 344 are formed over the sacrificial layer 340 while the live conductive pillars 345 are formed over corresponding bond pads (e.g., bond pads 310a and 310b). That is, forming the sacrificial pillars 344 over the sacrificial layer 340 includes attaching the sacrificial pillars to the sacrificial layer 340, and forming the live conductive pillars 345 over the corresponding bond pads 310 includes attaching the live conductive pillars 345 to the conductive seed layer 330 that is formed on the bond pads 310. Subsequently, the photoresist layer 335 defining the openings corresponding to the sacrificial pillars 344 and the live conductive pillars 345 has been removed.

FIG. 3C also illustrates the semiconductor die 305 after solder structures 350 have been formed on top surfaces of the sacrificial pillars 344 and the live conductive pillars 345. In some embodiments, the solder structures 350 may include a barrier layer 351 (e.g., including nickle (Ni)) and a solder material 352 (e.g., including tin-based alloy). As described herein with reference to FIG. 2A or 2B, the areal density of sacrificial pillars 344 in the sacrificial pillar regions 315 may have been determined to form the live conductive pillars 345 (e.g., two or more live conductive pillars in each individual live conductive pillar areas 320, two or more live conductive pillars in the live conductive pillar areas 320, taken together) to have heights within a predetermined range. That is, the resulting coplanarity of the live conductive pillars 345 of the semiconductor die 305 may mitigate risks of having non-joints and/or smashed joints during downstream bonding process steps (e.g., flip-chip bonding).

Moreover, FIG. 3C depicts that the sacrificial pillars 344 have top surfaces at approximately the same height (e.g., no more than 5% difference, no more than 10% difference, no more than 15% difference, or the like) as those of the live conductive pillars 345 and an approximately same width (e.g., the width W1 of the live conductive pillars 345 approximately same (e.g., no more than 5% difference, no more than 10% difference, no more than 15% difference, or the like) as the width W2 of the sacrificial pillars 344). But the present technology is not limited thereto. For example, the top surfaces of the sacrificial pillars 344 may not be at approximately the same height of the live conductive pillars 345. Further, the widths W2 of the sacrificial pillars 344 may be different from the width W1 of the live conductive pillars 345. Additionally, or alternatively, widths among sacrificial pillars 344 may be different from each other. That is, the dimensions or other structural attributes (e.g., heights, widths) of the sacrificial pillars 344 and the areal density of the sacrificial pillars 344 may be any combination suitable to reduce variations in heights of the live conductive pillars 345 (i.e., to improve the coplanarity of the live conductive pillars 345) within a tolerable limit, thereby mitigating various risks during the assembly process steps, which may be associated with non-joints or smashed joints (e.g., flip-chip bonding process steps).

Figure 3D:
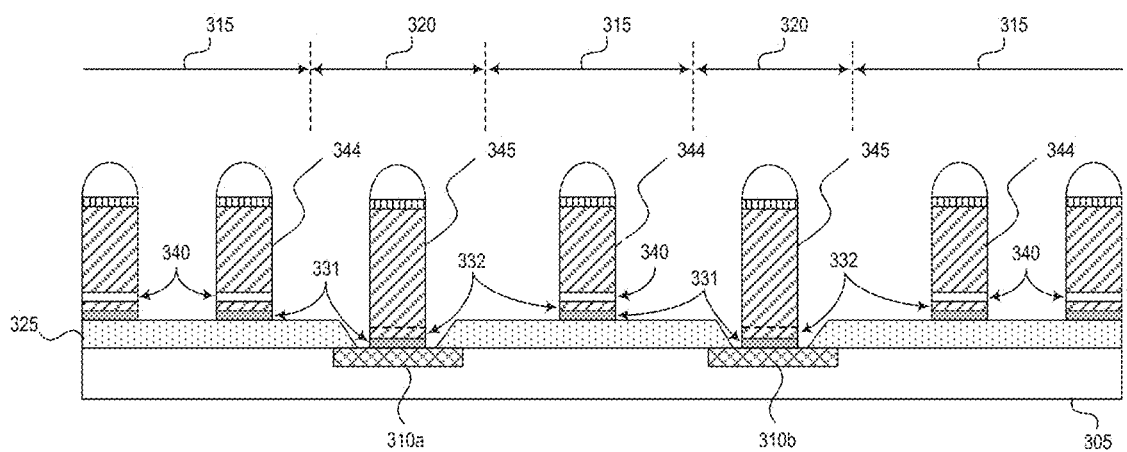

FIG. 3D illustrates the semiconductor die 305 after the sacrificial layer 340 and the seed layer 330 have been removed except in areas under the sacrificial pillars 344 and the conductive pillars 345. In some embodiments, a first etch process may be performed to remove the exposed portions of the sacrificial layer 340 from the sacrificial pillar regions 315. The first etch process may be selected against the seed layer 330, in some cases. For example, a blanket dry etch may be used to dry etch the sacrificial layer 340 stopping on the seed layer 330, with the sacrificial pillars 344 acting as hard masks (e.g., protecting the sacrificial layer 340 under the sacrificial pillars 344). Subsequently, a second etch process may be performed to remove the seed layer 330 (e.g., the conductive seed layer 332, the conductive adhesive layer 331, or both) that is not covered by the sacrificial pillars 344 or the conductive pillars 345. In some cases, the second etch process may include a wet etch process. In some embodiments, the wet etch process may have selectivity against the passivation layer 325 or the bond pad 310.

Figure 3E:
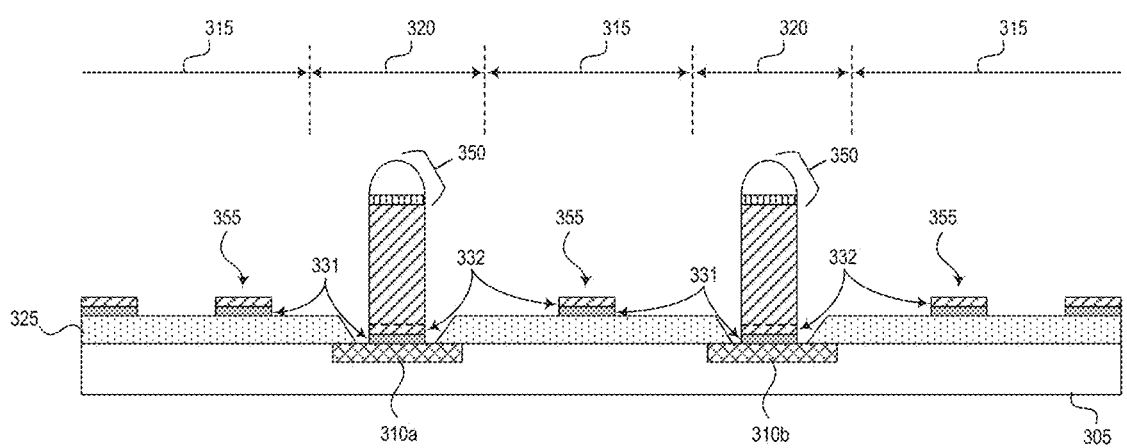

FIG. 3E illustrates the semiconductor die 305 after selectively removing the sacrificial pillars 344. In some embodiments, a wet etch process may be performed to remove the sacrificial layer 340 underneath the sacrificial pillars 344—i.e., undercutting the sacrificial pillars 344 such that the sacrificial pillars 344 may be detached from the semiconductor die 305. The wet etch process may have a selectivity against other materials exposed to the wet etch process (e.g., the passivation layer 325, the bond pads 310, the conductive pillars 345, the conductive seed layer 332, the conductive adhesive layer 331). This may be referred to as a lift-off process. The conductive pillars 345 remain on the semiconductor die 305 after the lift-off process. Removing the sacrificial pillars 344 may leave islands 355 of the seed layer 330 in the sacrificial regions 315. Further, the islands 355 may not be connected to an electrical signal of the semiconductor die 305—e.g., electrically floating. In some embodiments, photolithography processes may be used to cover the live conductive pillar areas 320 while exposing the sacrificial pillar regions 315. Subsequently, an etch process may be performed to remove the islands 355.

FIG. 3E illustrates that the islands 355 and the live conductive pillars 345 include a common metallic component (e.g., copper of the conductive seed layer 332, titanium of the conductive adhesive layer 331). Further, the islands 355 are shorter than the live conductive pillars 345. The live conductive pillars 345 include the solder structure 350 formed on top surfaces of the live conductive pillars 345. FIG. 3E also illustrates that the islands 355 can be attached to the passivation layer 325. As described herein, the heights of the live conductive pillars 345 may be within a range that may be determined based on the areal density of the islands 355 (e.g., the areal density of the sacrificial pillars 344 in the sacrificial pillar regions 315), the areal density of the live conductive pillars 345, or both. In some embodiments, the areal density of the islands 355 may be approximately same (e.g., no more than 5% difference, no more than 10% difference, no more than 15% difference, or the like) as the areal density of the live conductive pillars 345.

Figure 4:
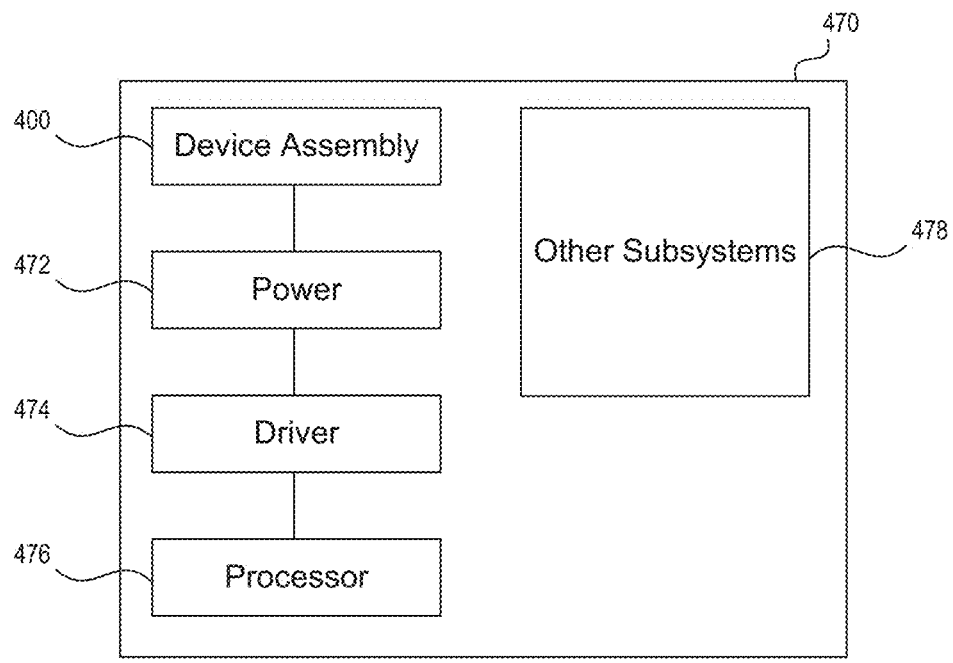
FIG. 4 is a block diagram schematically illustrating a system including a semiconductor device assembly configured in accordance with an embodiment of the present technology.

The semiconductor die 305 described with reference to FIG. 3E may be included in a semiconductor device assembly 400, which can be incorporated into any of a myriad of larger and/or more complex systems, a representative example of which is the system 470 shown schematically in FIG. 4. The system 470 can include a semiconductor device assembly 400, a power source 472, a driver 474, a processor 476, and/or other subsystems or components 478. The semiconductor device assembly 400 can include features generally similar to those of the live conductive pillars having a coplanarity within a tolerable limit as described herein (e.g., by utilizing sacrificial pillars), and can therefore mitigate various issues that may limit yield and/or reliability performance of the semiconductor device assembly 400—e.g., due to non-joints and/or smashed joints. The resulting system 470 can perform any of a wide variety of functions, such as memory storage, data processing, and/or other suitable functions. Accordingly, representative systems 470 can include, without limitation, hand-held devices (e.g., mobile phones, tablets, digital readers, and digital audio players), computers, and appliances. Components of the system 470 may be housed in a single unit or distributed over multiple, interconnected units (e.g., through a communications network). The components of the system 470 can also include remote devices and any of a wide variety of computer readable media.

Figure 5:
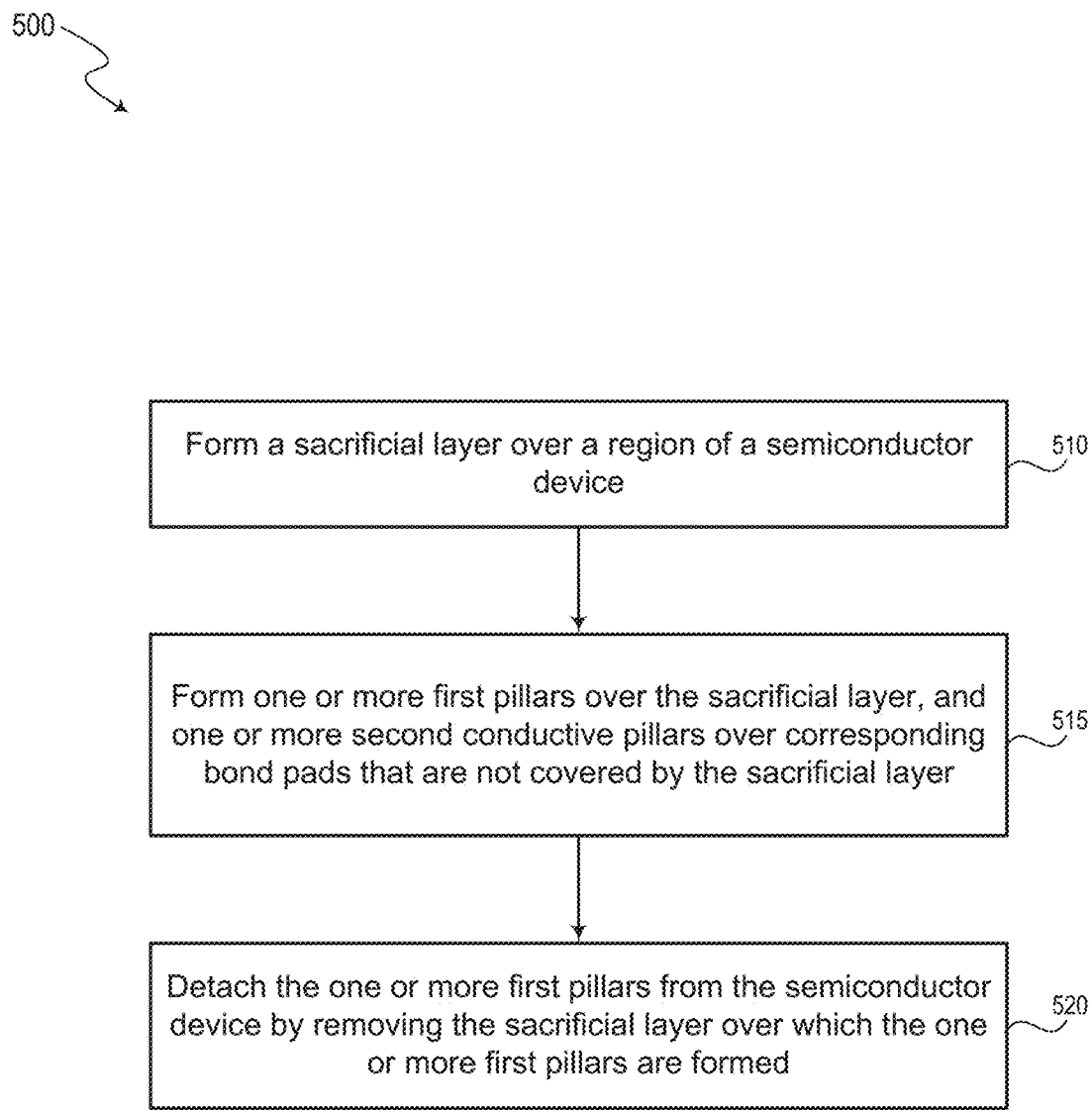
FIG. 5 is a flowchart of a method of utilizing sacrificial pillars of a semiconductor die in accordance with embodiments of the present technology.

FIG. 5 is a flowchart 500 illustrating a method of utilizing sacrificial pillars of a semiconductor die in accordance with embodiments of the present technology. The flowchart 500 may include aspects of methods as described with reference to FIGS. 2A, 2B, and 3A through 3E.

The method includes forming a sacrificial layer over a region of a semiconductor device (box 510). The method further includes forming one or more first pillars over the sacrificial layer, and one or more second conductive pillars over corresponding bond pads that are not covered by the sacrificial layer (box 515). The method further includes detaching the one or more first pillars from the semiconductor device by removing the sacrificial layer over which the one or more first pillars are formed (box 520).

In some embodiments, the method may further include determining a lateral dimension of the region that includes a first areal density of the one or more first pillars based on a second areal density of the one or more second conductive pillars. In some embodiments, the first areal density may correlate to the second areal density such that heights of the one or more second conductive pillars are within a predetermined range. In some embodiments, the first areal density is approximately same (e.g., no more than 5% difference, no more than 10% difference, no more than 15% difference, or the like) as the second areal density.

In some embodiments, the method may further include forming a seed layer over the semiconductor device, where the sacrificial layer is formed on the seed layer in the region, and the seed layer covers the bond pads. In some embodiments, forming the one or more first pillars over the sacrificial layer includes attaching the one or more first pillars to the sacrificial layer. In some embodiments, forming the one or more second conductive pillars over the corresponding bond pads includes attaching the one or more second conductive pillars to a seed layer that is formed on the bond pads.

In some embodiments, the method may further include removing the sacrificial layer from the region of the semiconductor device, where the one or more first pillars protect the sacrificial layer over which the one of more first conductive pillars are formed. In some embodiments, removing the sacrificial layer includes a blanket dry etch process having a selectivity against a seed layer. In some embodiments, the method may further include removing a seed layer from the region of the semiconductor device, the seed layer exposed as a result of removing the sacrificial layer. In some embodiments, the one or more sacrificial pillars are formed concurrently with the one or more second conductive pillars.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the sacrificial pillars are depicted to include one or more discrete structures (e.g., pillars) as described with reference to FIGS. 3C and 3D, other embodiments of the sacrificial pillars can be configured, for example, to include two or more pillars connected with an intermediate structure and/or structures having elongated rectangular shape cross-sections, etc. In addition, while in the illustrated embodiments certain features or components have been shown as having certain arrangements or configurations, other arrangements and configurations are possible. For example, although the sacrificial pillar regions are depicted to be placed in peripheral areas of the semiconductor die 205 as described with reference to FIG. 2A or 2B, other embodiments of the sacrificial pillar regions can be configured, for example, to include one or more sacrificial pillar regions placed between the areas including the active conductive pillars. In addition, certain aspects of the present technology described in the context of particular embodiments may also be combined or eliminated in other embodiments.

Further, although the sacrificial pillars are described to be formed using a plating process in the foregoing examples (e.g., the Cu plating process that concurrently forms the sacrificial pillars and live conductive pillars), the present technology is not limited thereto. For example, the sacrificial pillars may be separately formed at a different stage of the process, e.g., earlier or later than the stage forming the live conductive pillars. Additionally, or alternatively, the sacrificial pillars may include a different material (e.g., a non-conductive material) than that of the live conductive pillars. In some embodiments, a photoresist material (or other suitable materials that can be removed later) may be used to form the sacrificial pillars. In such embodiments, additional process steps including a separate photomask layer may be utilized to form the sacrificial pillars—e.g., the photomask layer corresponding to the resist layer 335 defining the openings 342 and 343 may be modified into two or more photomask layers. Such sacrificial pillars may help to mitigate certain risks during a direct chip attach method (e.g., avoiding a semiconductor die from being tilted, which may result in "smashed" joints), and may be subsequently removed.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:
1. A method comprising:
   forming a sacrificial layer over a region of a semiconductor device;
   forming one or more first pillars over the sacrificial layer, and one or more second conductive pillars over corresponding bond pads that are not covered by the sacrificial layer; and
   detaching the one or more first pillars from the semiconductor device by removing the sacrificial layer over which the one or more first pillars are formed.

2. The method of claim 1, further comprising:
determining a lateral dimension of the region that includes a first areal density of the one or more first pillars based on a second areal density of the one or more second conductive pillars.

3. The method of claim 2, wherein the first areal density correlates to the second areal density such that heights of the one or more second conductive pillars are within a predetermined range.

4. The method of claim 2, wherein the first areal density is approximately same as the second areal density.

5. The method of claim 1, further comprising:
forming a seed layer over the semiconductor device, wherein the sacrificial layer is formed on the seed layer in the region, and the seed layer covers the bond pads.

6. The method of claim 1, wherein:
forming the one or more first pillars over the sacrificial layer includes attaching the one or more first pillars to the sacrificial layer; and
forming the one or more second conductive pillars over the corresponding bond pads includes attaching the one or more second conductive pillars to a seed layer that is formed on the bond pads.

7. The method of claim 1, further comprising:
removing the sacrificial layer from the region of the semiconductor device, wherein the one or more first pillars protect the sacrificial layer over which the one of more first pillars are formed.

8. The method of claim 7, wherein removing the sacrificial layer includes a blanket dry etch process having a selectivity against a seed layer.

9. The method of claim 1, wherein the one or more sacrificial pillars are formed concurrently with the one or more second conductive pillars.

* * * * *